United States Patent [19]
Cserveny et al.

[11] Patent Number: 5,485,116
[45] Date of Patent: Jan. 16, 1996

[54] POWER DIVERTING CIRCUIT

[75] Inventors: Stefan Cserveny, Epalinges; Evert Dijkstra, Fontaines; Vincent von Kaenel, Coffrane, all of Switzerland

[73] Assignee: CSEM Centre Suisse d'Electronique et de Microtechnique SA - Recherche et Developpement, Neuchatel, Switzerland

[21] Appl. No.: 254,570

[22] Filed: Jun. 6, 1994

[51] Int. Cl.[6] ........................................ G05F 1/10
[52] U.S. Cl. ........................ 327/537; 327/530; 307/39
[58] Field of Search ................................. 327/530, 531, 327/532, 533, 534, 535, 536, 537, 547; 307/38, 39

[56] References Cited

U.S. PATENT DOCUMENTS

| | | | |
|---|---|---|---|
| 4,245,319 | 1/1981 | Hedges | 364/493 |
| 4,360,739 | 11/1982 | Goldstein | 307/132 E |
| 4,372,675 | 2/1983 | Sahay | 355/14 FU |
| 4,494,244 | 1/1985 | Arndt et al. | 455/78 |
| 4,631,623 | 12/1986 | Gohl | 327/530 |
| 5,034,626 | 7/1991 | Pirez et al. | 327/542 |
| 5,218,235 | 6/1991 | Patterson et al. | 307/39 |
| 5,327,072 | 7/1994 | Savignac et al. | 327/530 |

*Primary Examiner*—Timothy P. Callahan
*Assistant Examiner*—Kenneth B. Wells
*Attorney, Agent, or Firm*—Griffin, Butler, Whisenhunt & Kurtossy

[57] ABSTRACT

The invention concerns a power diverting circuit for creating a supply voltage for a signal processing circuit from a source of data signals each having a high or a low potential respectively corresponding to a first or a second logic state. The circuit comprises a first terminal for receiving the data signals, a second terminal for providing the supply voltage, a switch coupled between the first terminal and the second terminal for selectively connecting and disconnecting the first terminal and the second terminal, and an inverter for inverting the state of the data signals. The inverter, which has an input terminal connected to the first terminal and an output terminal for providing the inverted data signals to the signal processing circuit, is responsive to the state of the data signals received at the first terminal to control the operation of said switch means.

20 Claims, 4 Drawing Sheets

POWER DIVERTING CIRCUIT

BACKGROUND OF THE INVENTION

1. Field of the Invention

The present invention relates in general to circuits for diverting electrical power, and in particular to power diverting circuits for creating a supply voltage for a signal processing circuit from a source of data signals having a varying potential.

2. Description of Related Art

A computer may be connected to a peripheral device, such as a printer or external drive, by a cable or bus containing several signal lines running in parallel between the computer and the peripheral device. In order to control the operation of the peripheral device, the computer sends data signals thereto via the cable. It is often desirable, however, to be able to perform additional processing of these data signals by means of a separate circuit connected to the cable which receives and processes the data signals sent to the peripheral device.

In some applications, it is inconvenient to power such a signal processing circuit by a separate power supply. Such applications are provided with a power diverting circuit which diverts some power from the data signals received by the signal processing circuit and provides that power at an output terminal to a power supply terminal of the signal processing circuit.

FIG. 1 shows a block diagram of a computer 1 and a peripheral device 2 which are connected together by a data bus 3. Data signals are sent along the data bus 3 by means of several data signal lines, indicated by the references 3.1, 3.2, ..., 3.n. A signal processing circuit 4 is also coupled to the data bus 3 by means of its inputs 4.1, 4.2, 4.n, respectively connected to the data signal lines 3.1, 3.2, ... , 3.n. A power diverging circuit 5 is connected to the inputs of the signal processing circuit 4 and diverts some power from the data signals received at these inputs to a first power supply terminal 6 of the signal processing circuit 4.

The signal processing circuit 4 is also provided with a second power supply terminal 7 connected to a ground supply 8, this latter being connected to the ground supply (not shown) of either the computer 1 and/or the peripheral device 2. The voltage between the power supply terminals 6 and 7 drives the signal processing circuit 4. A capacitor 9 is connected between the power supply terminal 6 and the ground supply 8 in order to smooth the voltage supplied to the signal processing circuit 4 between the power supply terminals 6 and 7.

The power diverting circuit shown in FIG. 1 comprises a series of diodes or equivalent circuits, referenced 5.1, 5.2, ..., 5.n, having their anodes respectively connected to the signal processing circuit inputs 4.1, 4.2, ... , 4.n. The cathodes of the diodes 5.1, 5.2, ... , 5.n are connected together to the power supply terminal 6. It is often convenient to realise the signal processing circuit 4 and the power diverting circuit 5 in the form of an integrated circuit 10. The smoothing capacitor 9 is generally external as it is usually too large to be included in the integrated circuit 10.

In the case of TTL-compatible logic being used to communicate between the computer 1 and the peripheral 2, the data signals will either have a high potential of between 2.4 and 5.5 volts or a low potential of less than 0.8 volts, depending respectively on whether the data signal represents a logical "high" or a logical "low". In the event that the potential at the anode of one or more of the diodes 5.1, 5.2, ..., 5.n exceeds the potential at the power supply terminal 6 by an amount greater than the forward-biased voltage-drop across that diode, a bias current $I_{bias}$ will be caused to flow through that diode to the power supply terminal 6 so as to drive the integrated circuit 10.

The power diverting circuit 5 operates correctly provided that most of the time at least some of the data signal lines 3.1, 3.2, ..., 3.n are at a logical "high" and provided that these logically "high" lines can provide the necessary bias current $I_{bias}$ to drive the signal processing circuit 4. In order to assure that a sufficient bias voltage $V_{DD}$ is provided between the power supply terminals 6 and 7 for critical circuit functions, such as those provided by the analog blocks of the signal processing circuit 4, the voltage-drop across the power diverting circuit 5 must be minimised.

U.S. Pat. No. 5,218,235 describes a power diverting circuit which obtains a low voltage-drop in conduction by the use of a MOS transistor switch and a comparator associated with each input of the signal processing circuit 4. FIG. 2 represents part of the power diverting circuit described in the above-mentioned patent and shows a comparator 20 and a MOS transistor switch 21 associated with the input 4.1 of signal processing circuit 4. The comparator 20 has a positive input connected to the power supply terminal 6 and a negative input connected to the input 4.1 of the signal processing circuit 4. The comparator 20 is also connected to the power supply terminal 6 and the ground supply 8 and is driven by the voltage $V_{DD}$ there between.

A p-type MOS transistor switch 21 has its drain and source connected respectively to the power supply terminal 6 and the data processing circuit input 4.1. The gate of the MOS transistor 21 is controlled by the output of the comparator 20 in such a way that the MOS transistor 21 is caused to conduct when the voltage $V_{IN}$ between the input 4.1 and the ground supply is greater than the voltage VDD. Conversely, the MOS transistor 21 is caused to be non-conducting when the voltage $V_{IN}$ is less than the voltage VDD.

However, this solution provides a number of inconveniences. Firstly, the described power diverting circuit is quite complex, requiring the use of a separate comparator for each data signal line. The realisation of a large number of comparators, in an integrated form, requires the use of many transistors which thus occupy a large area and involve a significant power consumption. Secondly, by causing each MOS transistor to conduct only when the voltage $V_{IN}$ is greater than the voltage $V_{DD}$, the power supply voltage $V_{DD}$ provided by the power diverting circuit is sometimes unstable and ill-suited for use with signal processing circuitry. Thirdly, the implementation of logic decisions, such as the activation or deactivation of the power diverting circuit, may not be easily achieved.

An object of the present invention is to provide an efficient power diverting circuit for creating a supply voltage for a signal processing circuit from a source of data signals having a varying potential which overcomes or ameliorates the problems of existing power diverting circuits.

SUMMARY OF THE INVENTION

The present invention provides a power diverting circuit for creating a supply voltage for a signal processing circuit from a source of data signals each having a high or a low potential respectively corresponding to a first or a second logic state. The power diverting circuit comprises a first terminal for receiving the data signals, a second terminal for providing the supply voltage, switch means coupled between the first terminal and the second terminal for selectively connecting and disconnecting the first terminal and the second terminal, and an inverter for inverting the state of the data signals. The inverter has an input terminal connected to the first terminal and an output terminal for providing the inverted data signals to the signal processing circuit. The inverter is responsive to the state of the data signals received at the first terminal to control the operation of the switch means.

Accordingly, an efficient power diverting circuit is provided which is simpler to realise in integrated form, and thus has fewer parasitic effects associated therewith, has a shorter delay between state transitions, consumes less power and has a reduced failure rate than existing power diverting circuits.

In addition, the power diverting circuit of the present invention connects the terminal at which the data signals are received to the power supply terminal whenever the data signals have a "high" potential. An averaging effect of the "high" potentials provided to the power supply terminal is thus created, resulting in a more stable supply voltage than in existing power diverting circuits.

Other advantages and features of the invention will become apparent from the following description of various embodiments of the invention, given by way of example only, and the appended claims.

DESCRIPTION OF THE PREFERRED EMBODIMENTS

Figure 1:
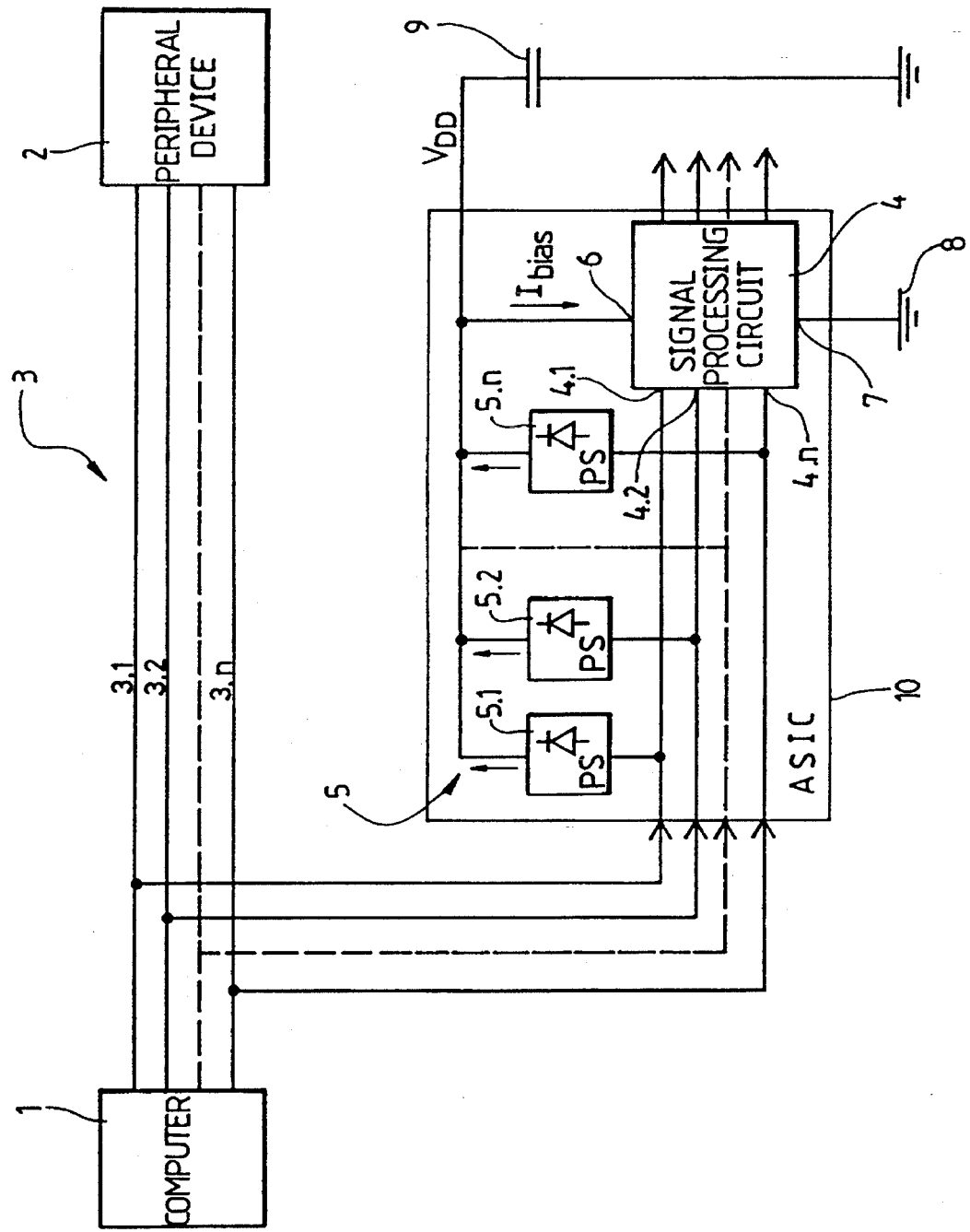
FIG. 1 is a block diagram of an electrical circuit comprising a signal processing circuit and a prior art power diverting circuit.
Figure 2:
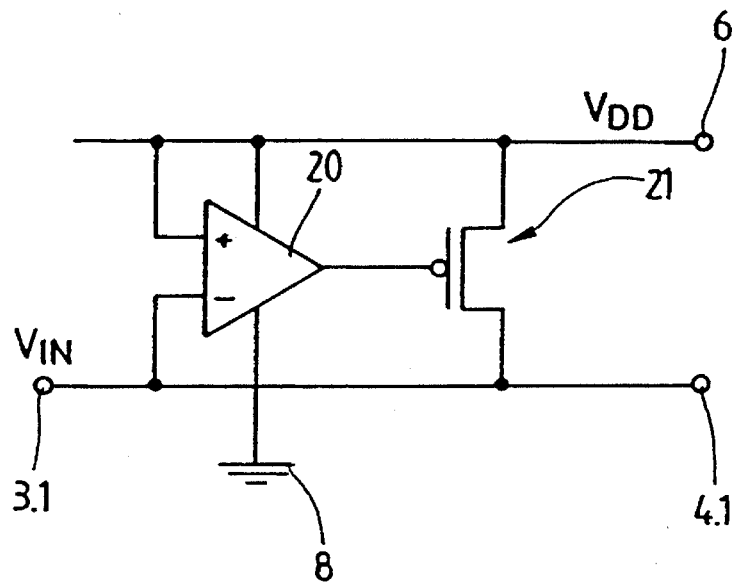
FIG. 2 is a circuit diagram of part of a prior art power diverting circuit.
Figure 3:
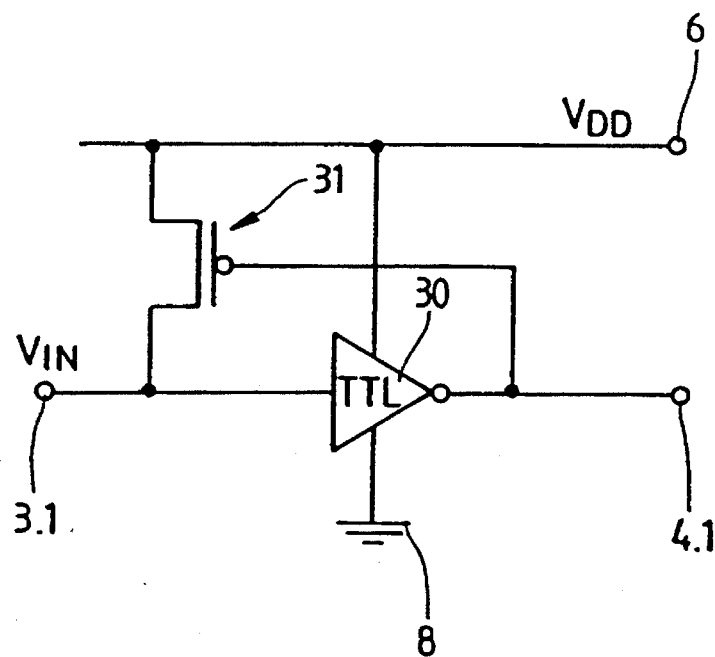
FIG. 3 is a circuit diagram of part of a first embodiment of a power diverting circuit according to the present invention.

The power diverting circuit according to the present invention comprises an inverter and a MOS transistor switch associated with each input of the signal processing circuit for which it provides a supply voltage. FIG. 3 shows a circuit diagram representing part of an embodiment of the power diverting circuit according to the invention and shows an inverter 30 and a MOS transistor switch 31 associated with the input 4.1 of signal processing circuit 4 represented in FIG. 1. An identical arrangement to that shown in FIG. 3 is also provided for the remaining inputs of the signal processing circuit 4. The inverter 30 has its input connected to the data signal line 3.1 and its output connected to the input 4.1 of the signal processing circuit 4. The inverter 30 is also connected to the power supply terminal 6 and the ground supply 8 and is driven by the voltage $V_{DD}$ there between.

The p-type MOS transistor switch 31 has its source and drain connected respectively to the power supply terminal 6 and the data signal line 3.1. The gate of the MOS transistor 31 is controlled by the output of the inverter 30 in such a way that the data signal line 3.1 is connected to the power supply terminal 6 every time the data signal present at the input of the inverter 30 is logically "high".

Data signal lines are thus connected to the power supply terminal 6 for all inputs which are "high", regardless of the value of the voltage $V_{DD}$. As the actual potentials corresponding to the "high" state of each data signal can differ or change suddenly, current will be drawn from those data signal lines whose data signals have a potential greater than VDD and flow into data signal lines which have a "high" level but nevertheless have a lower potential than $V_{DD}$. The data signal lines which have a low "high" potential may be so because the peripheral 2 draws a high level of current from that data signal line. The eventual current flowing from the power supply terminal 6 into such data signal lines will therefore be directed towards the peripheral 2 and reduce the current drawn from the computer 1. In this way, the power diverting circuit of the invention produces an averaging effect on the value of VDD, making it less sensitive to sudden changes or extreme conditions.

In the case of the computer 1 sending TTL-compatible data signals to the peripheral device 2, the integrated circuit 10 will in any event require the connection of an inverter between the input pad connected to each data signal line and the appropriate input of the signal processing circuit 4 so as to adapt the TTL-compatible data signal levels into the levels required for digital processing according to the resulting bias voltage $V_{DD}$. Accordingly, the inverter 30 as shown in FIG. 3 may be constituted by the inverter required to be connected between the input pad of the integrated circuit 10 associated with the data signal line 3.1 and the input 4.1 of the signal processing circuit 4. In this event, an additional inverter need not be created for the power diverting circuit of the present invention.

Figure 4:
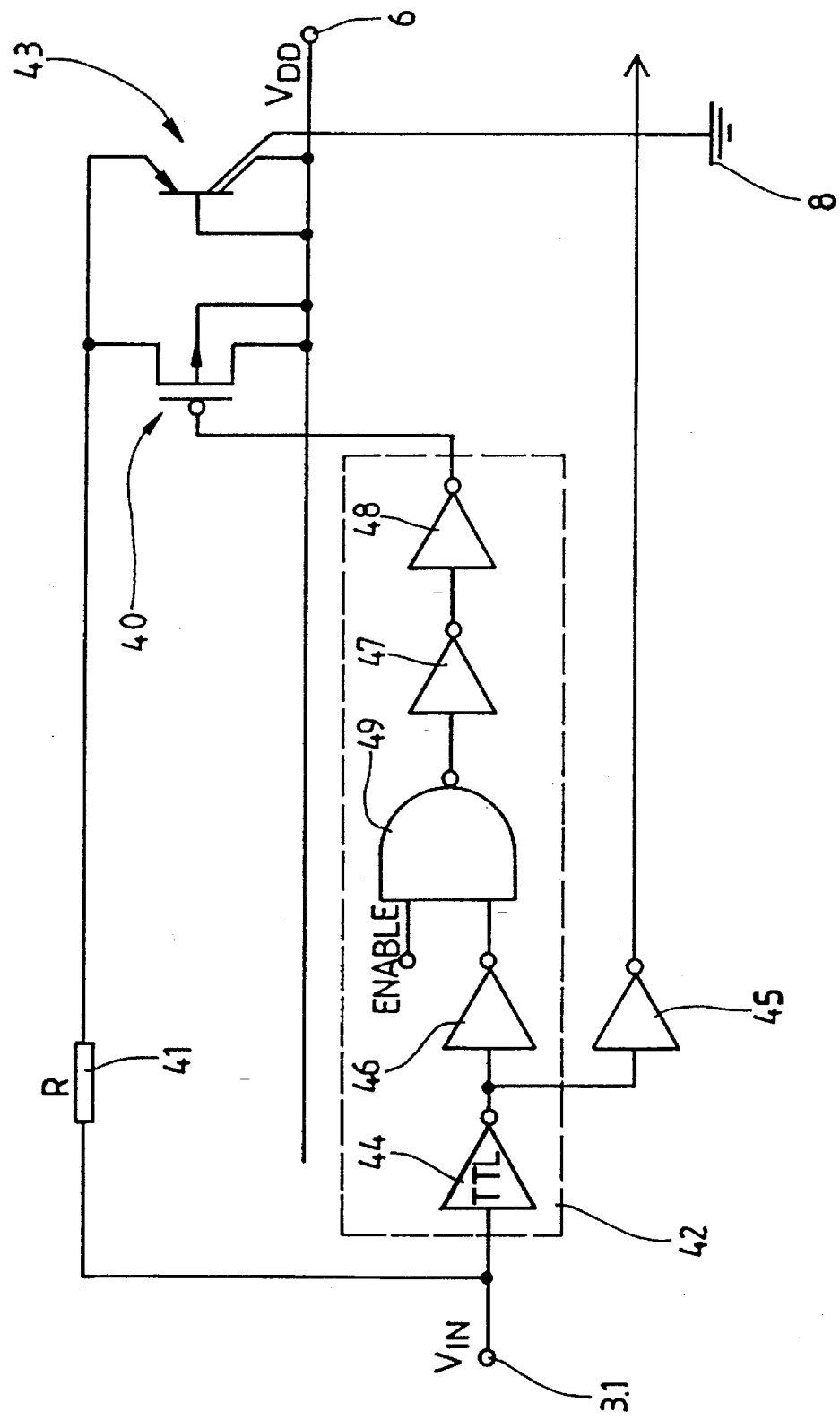
FIG. 4 is a circuit diagram of part of a second embodiment of a power diverting circuit according to the present invention; and, FIG. 5 is a circuit diagram of part of a third embodiment of a power diverting circuit according to the present invention.

FIG. 4 shows part of a second embodiment of the power diverting circuit of the present invention. Once again, an inverter and MOS transistor switch are both associated with an input 4.1 (FIG. 1) of a signal processing circuit 4. An identical arrangement is also provided for each of the remaining inputs of the signal processing circuit 4. A p-type MOS transistor switch 40 has its source connected to the power supply terminal 6 of the signal processing circuit 4. A resistor 41 is connected between the drain of the MOS transistor 40 and the data signal line 3.1. An inverter 42 has its input connected to the data signal line 3.1 and its output connected to the gate of the MOS transistor 40. As in the previously described embodiment, the inverter 42 is responsive to the state of the data signals on the data signal line 3.1 so as to control the operation of the MOS transistor 40.

To the MOS transistor 40 is associated by construction a parasitic pnp-type bipolar transistor 43 having two collectors, namely a lateral collector and a substrate-vertical collector. The emitter of the bipolar transistor 43 is connected to the drain of the MOS transistor 40, whilst the lateral collector and the substrate-vertical collector are respectively connected to the ground supply 8 and the power supply terminal 6. The lateral collector causes the bipolar transistor 43 to be connected as a diode, and will increase the current driving capability of the power diverting element, namely the MOS transistor switch 40, when it is forward biased (when $V_{IN} \gg V_{DD}$). It should be noted that not all the current diverted from the signal line will flow to the power supply terminal 6; some current will flow to the substrate via the vertical collector. If the power diverting circuit and the signal processing circuit 4 are to be realised in integrated form, it is therefore desirable to draw the layout of the total circuit to be integrated in such a way as to increase as much as possible the lateral collection efficiency of the bipolar transistor, by surrounding the emitter with the lateral collector.

The resistor 41 is included in the circuit shown in FIG. 4 to limit the current drawn from the signal line. The resistor 41, in conjunction with the capacitor 9, also acts so as to filter the signal line noise at very high frequencies.

The inverter 42 is a multistage inverter and comprises a first inverter stage 44, responsive to TTL-logic levels, having its input connected to the data signal line 3.1 and its output connected to the signal processing path of the signal processing circuit 4, as represented by the inverter 45. In addition, the multistage inverter 42 comprises the inverter stage 46, the NAND gate 49 and the inverter stages 47 and 48 connected together in cascade. The inverter stages 47 and 48 increase the driving capacity of the multistage inverter 42 in order to efficiently drive the MOS transistor 40, which is preferably large in order to minimise its forward-conduction voltage-drop.

The NAND gate 49 also acts as a control circuit for selectively operating the power diverting circuit. The NAND gate 49 has a first input connected to the output of the inverter stage 46 and its output connected to the input of the inverter stage 47. The NAND gate 49 further comprises a second input at which a logic signal may be applied so as to enable or disable the power diverting function of the circuit shown in FIG. 4. Thus, the MOS transistor 40 may be caused to be non-conductive regardless of the state of the data signals present on the data signal line 3.1. Such a control circuit may be desirable, for example, when it is also intended to use the integrated circuit input pad associated with that signal input line for the purposes of testing. In other embodiments, the control circuit 49 may have other functions than those described above.

In the event that the ground supply 8 is not able to be connected to the ground supply of either the computer 1 and/or the peripheral device 2, the potential of the ground supply 8 does not correspond to the ground potential of the computer 1 and/or the peripheral device 2. Since the threshold by which the inverter 30 of FIG. 3 detects the state of the data signals on the data signal line 3.1 is determined by the potential of the ground supply 8 and since the output of inverter 30 controls the MOS transistor switch 31, the switch may therefore not always connect the data signal line 3.1 to the power supply terminal 6 every time the data signal present at the input of the inverter 30 is logically "high".

Figure 5:
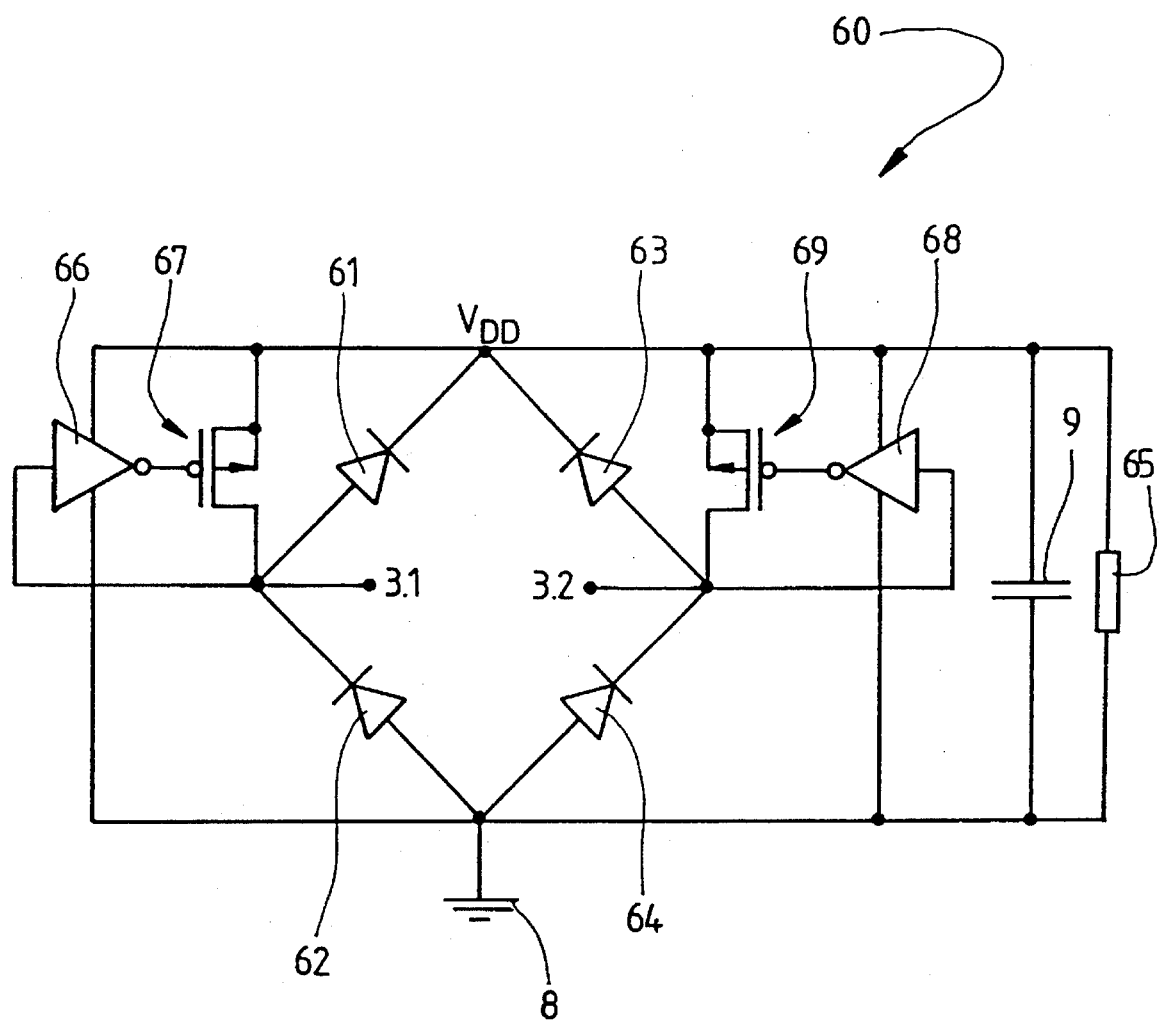

FIG. 5 shows a circuit 60 which addresses this inconvenience. The circuit 60 comprises four diodes 61, 62, 63 and 64 connected together so as to form a full-wave bridge rectifier circuit. The circuit 60 also comprises two inverters or equivalent circuits 66 and 68 which respectively control the operation of two p-type MOS transistor switches 67 and 69, in the manner described above in relation to FIG. 3. FIG. 6 also shows the capacitor 9 and a load resistance 65 connected together in parallel across the output of the bridge rectifier circuit formed by the diodes 61, 62, 63 and 64.

The inputs to the bridge rectifier circuit are connected to the data signal lines 3.1 and 3.2. Accordingly, the potential difference between the data signals on the data signal lines 3.1 and 3.2, rather than the absolute potentials of these data signals, is used to control the operation of the bridge rectifier. For example, if the data signals on the data signal lines 3.1 and 3.2 are respectively "high" and "low", the diodes 61 and 64 will be caused to conduct. Further, a "high" signal will be applied to the input of the inverter 66, which thus causes the MOS transistor 67 to connect the data signal line 3.1 to the capacitor 9.

Conversely, if the data signals on the data signal lines 3.1 and 3.2 are respectively "low" and "high", the diodes 62 and 63 will be caused to conduct and a "high" signal will be applied to the input of the inverter 68, thus causing the MOS transistor 69 to connect the data signal line 3.2 to the capacitor 9.

Of course, this same circuit 60 may also be used in applications where the ground supply of the computer 1 or the peripheral device 2 is available. In this case, a data signal line will be connected to one of the inputs of the bridge rectifier circuit whilst the ground supply of the computer 1 and/or the peripheral device 2 will be connected to the other input.

It will be understood that various modifications and improvements may be made to the power diverting circuit as described here above, without departing from the ambit of the present invention.

For example, whilst the embodiments of the power diverting circuit have been described here above with respect to TTL logic levels, it is to be understood that the invention it also applicable to CMOS or any other logic level in which logic sEates are represented by corresponding different values of potential in a data signal. In addition, whilst a power diverting circuit for diverting power from data signals on several data signal lines has been described above, the invention is also applicable to circuits in which one or more data signal lines are used.

What is claimed is:

1. A power diverting circuit for creating a supply voltage for a signal processing circuit from a source of data signals each having a high or a low potential respectively corresponding to a first or a second logic state, said circuit comprising:

a first terminal for receiving said data signals;

a second terminal at which said supply voltage is manifested;

switch means for selectively connecting said first terminal to said second terminal and disconnecting said first terminal from said second terminal;

an inverter for inverting the state of said data signals, said inverter having an input terminal connected to said first terminal and an output terminal for providing inverted data signals to said signal processing circuit; and, connecting means connecting said inverter to said switch means whereby said inverter, in response to the state of said data signals received at said first terminal controls the operation of said switch means.

2. A power diverting circuit according to claim 1, wherein said high potential and said low potential are TTL logic level potentials and said inverter comprises a first inverter stage responsive to TTL logic level potentials for producing said inverted data signals.

3. A power diverting circuit according to claim 2, wherein said inverter further comprises one or more second inverter stages connected in cascade to the output of said first inverter stage.

4. A power diverting circuit according to claim 3, wherein said inverter further comprises a control circuit for selectively enabling said inverter to apply output signals to said connecting means in response to the state of said data signals received at said first terminal, said control circuit comprising at least one logic gate connected between two inverter stages.

5. A power diverting circuit according to claim 4, wherein said control circuit comprises a NAND gate having a first input and an output connected respectively to an output and an input of two inverter stages and further having a second input to which control signals may be applied to enable said inverter to produce said output signals.

6. A power diverting circuit according to claim 1, further comprising a resistor connected between said first terminal and said switch means.

7. A power diverting circuit according to claim 1, wherein said switch means comprises a MOS transistor switch.

8. A power diverting circuit as claimed in claim 1, wherein said switch means is electrically connected to said first terminal and said second terminal.

9. A power diverting circuit for creating a supply voltage for a signal processing circuit from a first source of data signals each having a high or a low potential respectively corresponding to a first or a second logic state, said circuit comprising:

a first terminal for receiving said data signals;

a second terminal at which said supply voltage is manifested;

a bridge rectifier having a first input and a second input and a first output and a second output, said first rectifier input being connected to said first terminal, said first rectifier output being connected to said second terminal;

first switch means for selectively connecting said first terminal to said second terminal and disconnecting said first terminal from said second terminal;

a first inverter having an input terminal connected to said first terminal and an output terminal connected so as to control the operation of said first switch means;

second switch means for selectively connecting said second rectifier input to said second terminal and disconnecting said second rectifier input from said second terminal; and, a second inverter having an input terminal connected to said second rectifier input and an output terminal connected so as to control the operation of said second switch means.

10. A power diverting circuit according to claim 9, wherein said second rectifier input is connected to a second source of data signals each having a high or a low potential respectively corresponding to a first or a second logic state.

11. A power diverting circuit according to claim 2, said power diverting circuit further comprising a resistor connected between said first terminal and said switch means.

12. A power diverting circuit according to claim 3, said power diverting circuit further comprising a resistor connected between said first terminal and said switch means.

13. A power diverting circuit according to claim 4, said power diverting circuit further comprising a resistor connected between said first terminal and said switch means.

14. A power diverting circuit according to claim 5, said power diverting circuit further comprising a resistor connected between said first terminal and said switch means.

15. A power diverting circuit according to claim 2, wherein said switch means comprises a MOS transistor switch.

16. A power diverting circuit according to claim 3, wherein said switch means comprises a MOS transistor switch.

17. A power diverting circuit according to claim 4, wherein said switch means comprises a MOS transistor switch.

18. A power diverting circuit according to claim 5, wherein said switch means comprises a MOS transistor switch.

19. A power diverting circuit according to claim 6, wherein said switch means comprises a MOS transistor switch.

20. A power diverging circuit as claimed in claim 8, wherein said first switch means is electrically connected between said first terminal and said second terminal and said second switch means is electrically connected between said second rectifier input and said second terminal.

* * * * *